US007649412B2

(12) United States Patent
Horiguchi et al.

(10) Patent No.: US 7,649,412 B2
(45) Date of Patent: Jan. 19, 2010

(54) HIGH EFFICIENCY AMPLIFIER (75) Inventors: Kenichi Horiguchi, Chiyoda-ku (JP);
Satoru Ishizaka, Chiyoda-ku (JP);
Kazuhisa Yamauchi, Chiyoda-ku (JP);
Masatoshi Nakayama, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 210 days.

(21) Appl. No.: 11/921,504

(22) PCT Filed: Jul. 31, 2006

(86) PCT No.: PCT/JP2006/315153

§ 371 (c)(1),
(2), (4) Date: Dec. 4, 2007

(87) PCT Pub. No.: WO2007/015462

PCT Pub. Date: Feb. 8, 2007

(65) Prior Publication Data

US 2009/0206926 A1 Aug. 20, 2009

(30) Foreign Application Priority Data

Aug. 1, 2005 (JP) ............................. 2005-222986

(51) Int. Cl.
*H03F 3/68* (2006.01)
(52) U.S. Cl. .................... 330/124 R; 330/295
(58) Field of Classification Search ............. 330/124 R, 330/295, 84, 126
See application file for complete search history.

(56) References Cited

U.S. PATENT DOCUMENTS

| 6,472,934 | B1 * | 10/2002 | Pehlke ......................... 330/10 |
| 6,617,929 | B2 * | 9/2003 | Kim et al. .................... 330/295 |
| 6,853,245 | B2 * | 2/2005 | Kim et al. ............... 330/124 R |
| 2004/0113698 | A1 | 6/2004 | Kim et al. |

FOREIGN PATENT DOCUMENTS

| EP | 1 583 228 A2 | 10/2005 |
| JP | 2000 196387 | 7/2000 |
| JP | 2003 188651 | 7/2003 |
| JP | 2004 503161 | 1/2004 |

(Continued)

OTHER PUBLICATIONS

Ishii, et al., "An Optimization of Peaking Amplifier in doherty Configuration", The Institute of Electronics, Information and Communication Engineers Sogo Taikai Koen Ronbunshu C-2-7, vol. 49, No. 12, p. 40, 2005.

(Continued)

*Primary Examiner*—Henry K Choe
(74) *Attorney, Agent, or Firm*—Oblon, Spivak, McClelland, Maier & Neustadt, L.L.P.

(57) ABSTRACT

When an input signal level is small, the electrical length of a phase line 21 and the electrical length of a phase line 23 are set in such a manner that the impedance seen by looking into the output side from an impedance reference point 11 at the output side of a carrier amplifier 3 becomes $2R+\alpha$ (where R is a load resistance and $\alpha$ is positive), and the electrical length of a phase line 22 is set at a difference between the electrical length of the phase line 21 and the electrical length of the phase line 23.

5 Claims, 12 Drawing Sheets

FOREIGN PATENT DOCUMENTS

| | | |
|---|---|---|
| JP | 2006-166141 | 6/2006 |
| WO | WO 97/20385 | 6/1997 |
| WO | WO 01/91282 A2 | 11/2001 |

OTHER PUBLICATIONS

Goto, et al., "Design and Fabrication of Doherty Amplifier with Combination of Class-F and Inverse Class F Amplifiers", The Institute of Electronics, Information and Communication Engineers Sogo Taikai Koen Ronbunshu C-2-8, p. 41, 2005.

Yang, et al., "A Fully Matched N-Way Doherty Amplifier With Optimized Linearity", IEEE Transactions on Microwave Theory Techniques., vol. 51 No. 3, pp. 986-993, 2003.

Kenichi Horiguchi, et al., "Efficiency Enhancement of 250W Doherty Power Amplifiers Using Virtual Open Stub Techniques for UHF-band OFDM Applications", Microwave Symposium Digest, 2006, IEEE, MTT-S International, XP031018731, Jun. 1, 2006, pp. 1356-1359.

Kyoung-Joon Cho, et al., "N-Way Distributed Doherty Amplifier with an Extended Efficiency Range", Microwave Symposium, 2007, IEEE/MTT-S International, XP031112249, Jun. 1, 2007, pp. 1581-1584.

* cited by examiner

- - - - Prior Art
———— Embodiment 1

FIG.4

- - - - Prior Art
———— Embodiment 1

Electrical Length $\theta_0$ Of Phase Line

FIG.15

HIGH EFFICIENCY AMPLIFIER

TECHNICAL FIELD

The present invention relates to a high efficiency amplifier used for broadcasting and communications.

BACKGROUND ART

An RF amplifier used for broadcasting and communications is expected to amplify an RF signal at high efficiency and linearity. As for the amplifier, however, increasing the efficiency and increasing the linearity are incompatible in general. The efficiency of the amplifier exhibits such a characteristic as increasing with the power level of an input signal, and reaching the maximum efficiency in the neighborhood where the amplifier saturates. When using as the input signal a modulating wave with a large PAPR (Peak to Average Power Ratio) that has been used by broadcasting and mobile communications recently, the linearity deteriorates greatly at an operating point near the saturating point because of the clipping of a signal waveform due to saturation of the amplifier.

Therefore the RF amplifier used for broadcasting and communications is generally used at an operating level having a large output back-off from the saturating point. Accordingly, achieving the high efficiency at the operating level having the large output back-off from the saturating point is important. In contrast with this, as an effective technique of increasing the efficiency at the operating level having the large output back-off from the saturating point, a Doherty amplifier is reported.

Figure 14:
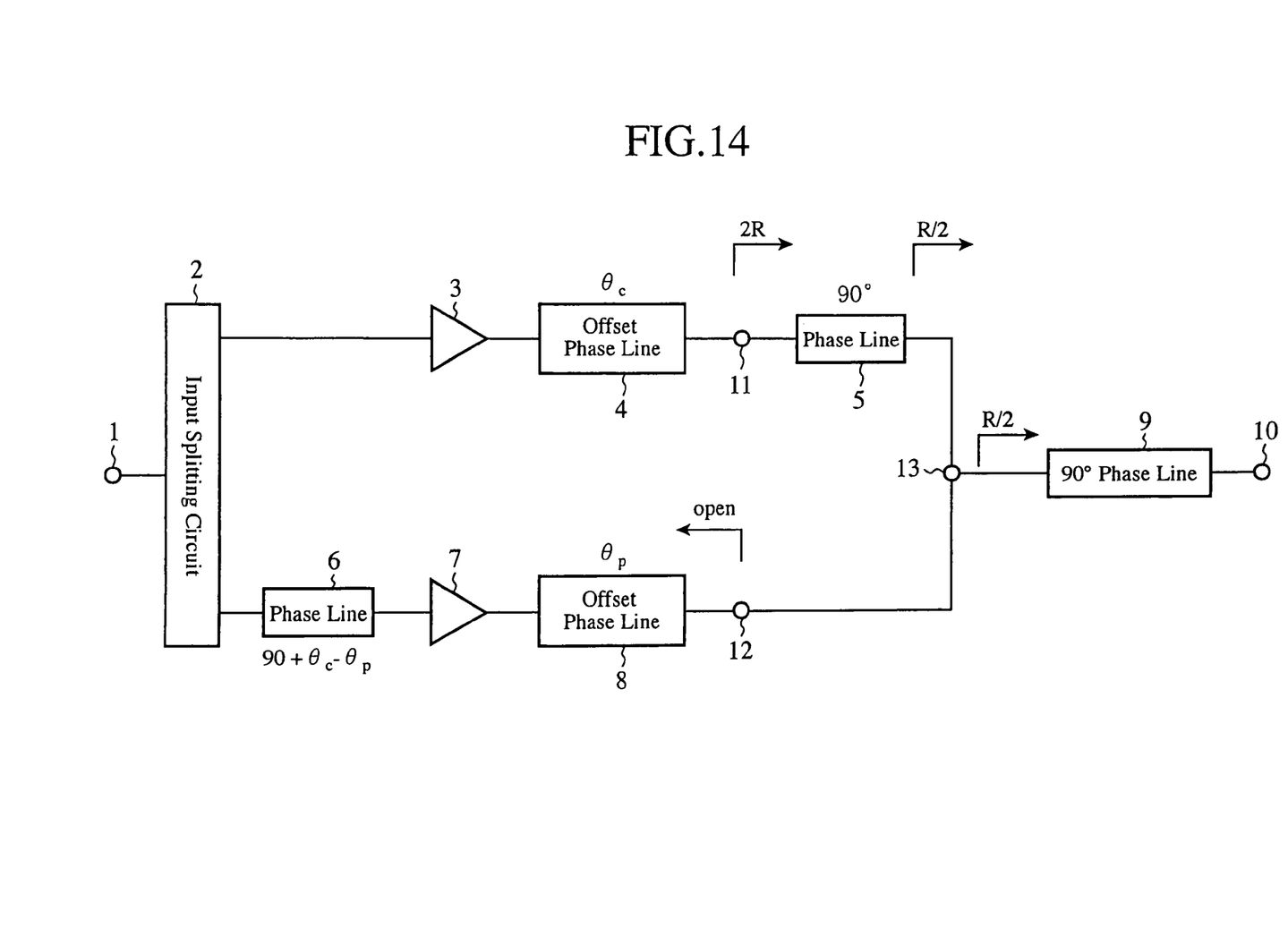
FIG. 14 is a block diagram showing a configuration of a Doherty amplifier as a conventional high efficiency amplifier, electrical lengths of its various portions, and impedances viewed from various points when the input signal level is small.

For example, FIG. 14 shows a configuration of a Doherty amplifier as a conventional high efficiency amplifier described in Non-Patent Document 1, electrical lengths of its various portions, and impedances viewed from its various portions when the input signal level is small. The Doherty amplifier shown in FIG. 14 has an input terminal 1, an input splitting circuit 2, a class A or class AB biased carrier amplifier 3, an offset phase line 4, a 90° phase line 5, a phase line 6, a class B or class C biased peak amplifier 7, an offset phase line 8, a 90° phase line 9 and an output terminal 10.

In addition, FIG. 14 shows an impedance reference point 11 at the output side of the carrier amplifier 3, an impedance reference point 12 at the output side of the peak amplifier 7, and an output combining point 13 of the paths into which the input splitting circuit 2 splits the input. Here, the impedance reference point 11 at the output side of the carrier amplifier 3 is the point at which the load impedance seen by looking into the load side from the output side of the carrier amplifier 3 becomes maximum. Likewise, the impedance reference point 12 at the output side of the peak amplifier 7 is the point at which the impedance seen by looking into the output side of the offset phase line 8 from the output side of the peak amplifier 7 becomes maximum.

Figure 15:
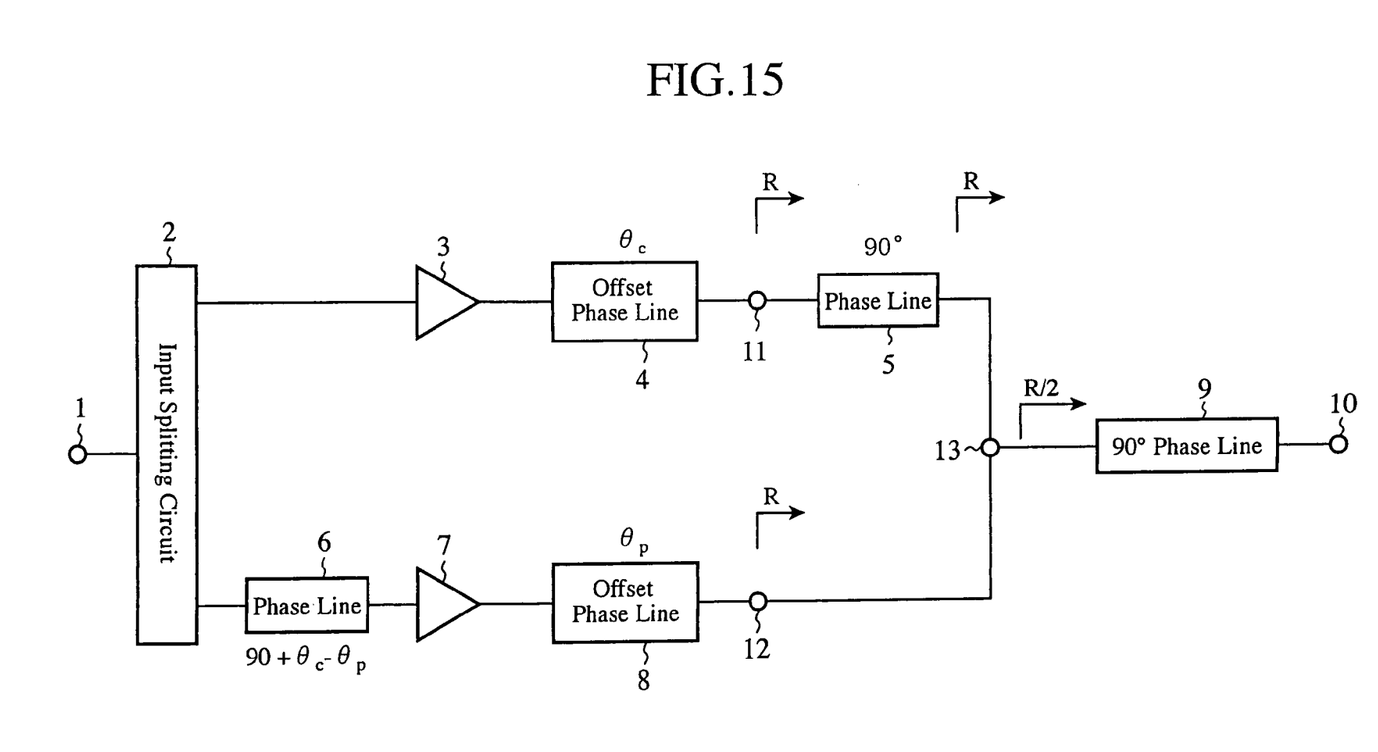
FIG. 15 is a block diagram showing the configuration of the Doherty amplifier as a conventional high efficiency amplifier, electrical lengths of its various portions, and impedances viewed from various points when the input signal level is large.

FIG. 15 shows the configuration of the Doherty amplifier as the conventional high efficiency amplifier described in the foregoing Non-Patent Document 1, the electrical lengths of its various portions, and the impedances seen from various portions when the input signal level is large. In FIG. 15, the same reference numerals as those of FIG. 14 designate the same components.

The offset phase line 4 connected to the carrier amplifier 3 has such an electrical length $\theta_c$ that will maximize the output impedance seen by looking into the output side of the carrier amplifier 3 from the impedance reference point 11 at the output side of the carrier amplifier 3. Likewise, the offset phase line 8 connected to the peak amplifier 7 has such an electrical length $\theta_p$ that will maximize the output impedance seen by looking into the output side of the peak amplifier 7 from the impedance reference point 12 at the output side of the peak amplifier 7. In addition, the electrical length of the 90° phase line 5 and that of the 90° phase line 9 are 90°, and the electrical length of the phase line 6 is $90+\theta_c-\theta_p$.

The RF signal input via the input terminal 1 is divided by the input side splitting circuit 2 into two parts: a carrier amplifier 3 side path and a peak amplifier 7 side path. Along the carrier amplifier 3 side path, the RF signal from the input side splitting circuit 3 is supplied to the carrier amplifier 3, and the RF signal from the carrier amplifier 3 is supplied to the output combining point 13 via the offset phase line 4 and 90° phase line 5. On the other hand, along the peak amplifier 7 side path, the RF signal from the input side splitting circuit 2 is supplied to the peak amplifier 7 via the phase line 6, and the RF signal from the peak amplifier 7 is supplied to the output combining point 13 via the offset phase line 8. The output combining point 13 combines the RF signal from the carrier amplifier 3 with the RF output signal from the peak amplifier 7, and outputs the combined signal.

When the level of the input signal is small in FIG. 14, the class B or class C biased peak amplifier 7 becomes an OFF state, that is, the state in which the RF signal is not amplified. Thus, the output impedance of the peak amplifier 7 seen from the impedance reference point 12 at the output side of the peak amplifier 7 is ideally infinity (open) because of the effect of the offset phase line 8. In the conventional Doherty amplifier, the impedance reference point 12 and the output combining point 13 are connected directly so that they are considered to be the same point. Accordingly, the output impedance seen by looking into the peak amplifier 7 side from the output combining point 13 is ideally infinity (open).

In this case, assume that the load impedance seen by looking into the 90° phase line 9 from the output combining point 13 is R/2 (where R is the load resistance of the Doherty amplifier) and that the characteristic impedance of the 90° phase line 5 is R. Then, according to the impedance conversion effect by the 90° phase line 5, the load impedance seen by looking into the output side from the impedance reference point 11 at the output side of the carrier amplifier 3 becomes 2R, and only the RF signal from the carrier amplifier 3 is output from the output combining point 13.

On the other hand, when the input signal level is large in FIG. 15, the class B or class C biased peak amplifier 7 is brought into an ON state, that is, into the state in which the RF signal is amplified. Accordingly, at the output combining point 13, the RF signals from the carrier amplifier 3 and peak amplifier 7 are combined to be output. In this case, the load impedances seen by looking into the output side from the impedance reference point 11 at the output side of the carrier amplifier 3 and from the impedance reference point 12 at the output side of the peak amplifier 7 become R each.

Here, if the Doherty amplifier is designed in advance in such a manner that when the load impedance is 2R, the carrier amplifier 3 has low saturation power but high efficiency, and that when the load impedance is R, the carrier amplifier 3 and peak amplifier 7 each have large saturation power, then it is possible for the carrier amplifier 3 to operate at high efficiency when the input signal level is small, and for the carrier amplifier 3 and peak amplifier 7 to operate in such a manner that they have large saturation power when the input signal level is large.

According to the two functions, that is, the function that the output of the peak amplifier 7 is combined with that of the carrier amplifier 3 in response to the input signal level, and the function that the load impedance seen by looking into the output side from the carrier amplifier 3 and peak amplifier 7 varies in response to the input signal level, it becomes possible to implement the high efficiency operation in the state in which the output back-off from the saturation is large.

Figure 16:
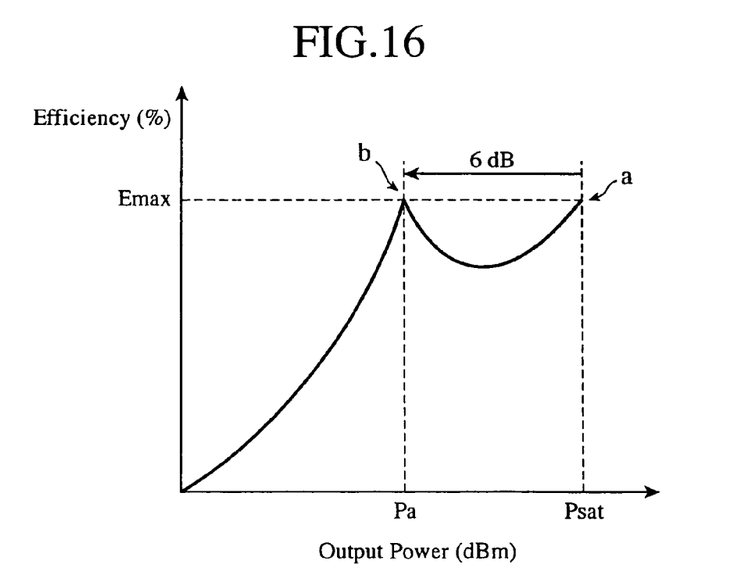
FIG. 16 is a graph illustrating efficiency characteristics versus output power of the Doherty amplifier as a conventional high efficiency amplifier.

FIG. 16 illustrates efficiency characteristics versus output power of the Doherty amplifier. It is possible for the ideal Doherty amplifier to have two points at which the efficiency is maximum: the saturating point a of the Doherty amplifier; and the point b at which the output back-off is 6 dB as shown in FIG. 16. In FIG. 16, b is the first efficiency maximum point when only the carrier amplifier 3 operates when the input signal level is small, and a is the second efficiency maximum point when the carrier amplifier 3 and peak amplifier 7 operate when the input signal level is large.

Non-Patent Document 1: Youngoo Yang, Jeonghyeon Cha, Bumjae Shin, Bumman Kim, "A Fully Matched N-Way Doherty Amplifier With Optimized Linearity", IEEE Trans. Microwave Theory Tech., vol. 3, pp. 986-993, March 2003.

In the Doherty amplifier as a conventional high efficiency amplifier, by using the 90° phase line 5 at the output side of the carrier amplifier 3, such conversion is implemented that the load impedance seen by looking into the output side from the impedance reference point 11 at the output side of the carrier amplifier 3 becomes 2R at a small signal and becomes R at a large signal. Therefore it is possible for the ideal Doherty amplifier to have two points at which the efficiency is maximum, that is, the saturating point of the Doherty amplifier and the point at which the output back-off is 6 dB. Conversely, it is theoretically impossible for the conventional Doherty amplifier to have the efficiency maximum point at an operating point at which the output back-off is greater than 6 dB. Thus, it has a problem of having its limit on achieving the high efficiency in a small signal region in which the output back-off is greater than 6 dB.

The present invention is implemented to solve the foregoing problem. Therefore it is an object of the present invention to provide a high efficiency amplifier capable of increasing the efficiency at the small signal operating level at which the output back-off is greater than 6 dB.

DISCLOSURE OF THE INVENTION

A high efficiency amplifier in accordance with the present invention includes: an input splitting circuit for splitting an input signal into first and second paths; a carrier amplifier connected to the first path; a peak amplifier connected to the second path; an impedance converting circuit connected to an output combining point of the first and second paths; a first phase line connected between an impedance reference point at an output side of the carrier amplifier and the output combining point; a second phase line connected between the input splitting circuit and the peak amplifier; and a third phase line connected between an impedance reference point at an output side of the peak amplifier and the output combining point, wherein when a level of the input signal is small, an electrical length of the first phase line and an electrical length of the third phase line are set in a manner that impedance seen by looking into an output side from the impedance reference point at the output side of the carrier amplifier is made 2R+α (where R is a load resistance and α is positive), and an electrical length of the second phase line is set at a difference between the electrical length of the first phase line and the electrical length of the third phase line.

According to the present invention, the output back-off that will maximize the efficiency can be made greater than 6 dB. Thus, it offers an advantage of being able to improve the efficiency at the small signal operating level at which the output back-off is greater than 6 dB.

BEST MODE FOR CARRYING OUT THE INVENTION

The best mode for carrying out the invention will now be described with reference to the accompanying drawings to explain the present invention in more detail.

Embodiment 1

Figure 1:
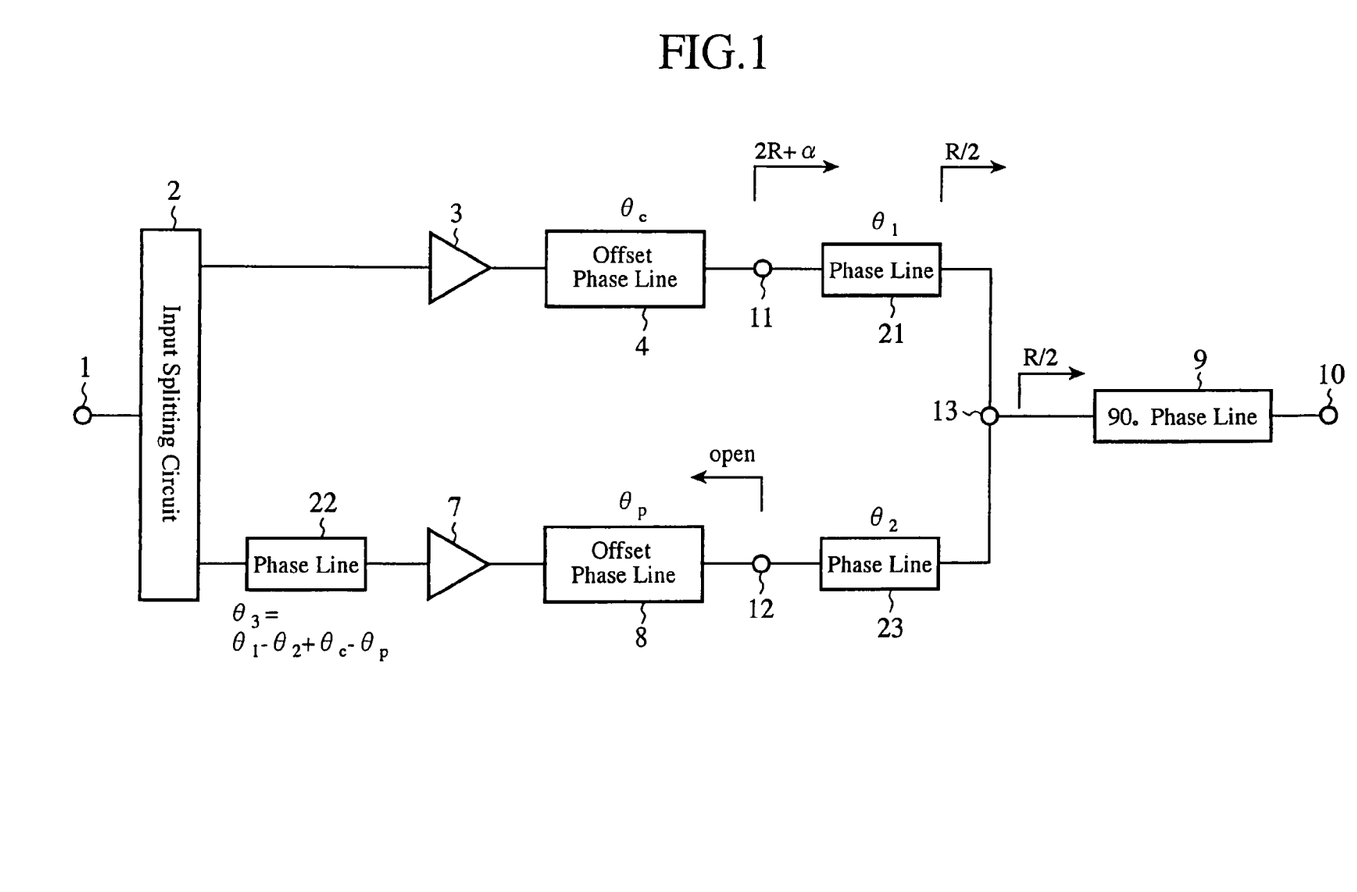
FIG. 1 is a block diagram showing a configuration of a high efficiency amplifier of an embodiment 1 in accordance with the present invention, electrical lengths of its various portions, and impedances viewed from various points when the input signal level is small.

FIG. 1 is a block diagram showing a configuration of the high efficiency amplifier of an embodiment 1 in accordance with the present invention, electrical lengths of its various portions, and impedances viewed from various points when the input signal level is small. The high efficiency amplifier shown in FIG. 1 has an input terminal 1, an input splitting circuit 2, a class A or class AB biased carrier amplifier 3, an offset phase line 4, a phase line 21, a phase line 22, a class B or class C biased peak amplifier 7, an offset phase line 8, a phase line 23, a 90° phase line (impedance converting circuit) 9 and an output terminal 10. In addition, as conventional FIG. 14, FIG. 1 shows the impedance reference point 11 at the output side of the carrier amplifier 3, the impedance reference point 12 at the output side of the peak amplifier 7, and the output combining point 13 of the paths into which the input splitting circuit 2 divides the input.

The high efficiency amplifier shown in FIG. 1 is the same as the configuration of FIG. 14 except that the 90° phase line 5 of the Doherty amplifier shown in conventional FIG. 14 is replaced by a phase line 21, the phase line 6 is replaced by a phase line 22, and a phase line 23 is added between the impedance reference point 12 at the output side of the peak amplifier 7 and the output combining point 13. Assume that the electrical length of the offset phase line 4 is $\theta_c$, the electrical length of the offset phase line 8 is $\theta_p$, the electrical length of the phase line 21 is $\theta_1$, the electrical length of the phase line 22 is $\theta_3$, and the electrical length of the phase line 23 is $\theta_2$.

In other words, the high efficiency amplifier shown in FIG. 1 is characterized by that the phase line 21 with the electrical length $\theta_1$ is connected between the impedance reference point 11 at the output side of the carrier amplifier 3 and the output combining point 13, the phase line 22 with the electrical length $\theta_3$ is connected between the input splitting circuit 2 and the peak amplifier 7, and the phase line 23 with the electrical length $\theta_2$ is connected between the impedance reference point 12 at the output side of the peak amplifier 7 and the output combining point 13.

In FIG. 1, assume that the impedance seen by looking into the 90° phase line 9 from the output combining point 13 is $R_1 = R/2$ (R is the load resistance of the high efficiency amplifier), and the impedance of the phase line 21 is R. To make the output back-off that will maximize the efficiency greater than 6 dB when the input signal level is small, the electrical length $\theta_1$ of the phase line 21 and the electrical length $\theta_2$ of the phase line 23 are set in such a manner that the impedance seen by looking into the output side from the impedance reference point 11 at the output side of the carrier amplifier 3 becomes $R_2 = 2R + \alpha$ (where $\alpha$ is positive).

The phase line 21, which is a phase line having the electrical length $\theta_1$ [deg] given by the following expression (1), is connected between the impedance reference point 11 at the output side of the carrier amplifier 3 and the output combining point 13.

$$\theta_1 = \tan^{-1}\left[-\left\{\frac{R_2 \cdot (R_2 - R_1)}{R_1 \cdot R_2 - Z_0^2}\right\}^{\frac{1}{2}}\right] \quad (90 < \theta_1 < 180) \tag{1}$$

where $Z_0$ is the characteristic impedance of the phase lines 21 and 23.

In addition, the phase line 23, which is a phase line having the electrical length $\theta_2$ [deg] given by the following expression (2), is connected between the impedance reference point 12 at the output side of the peak amplifier 7 and the output combining point 13.

$$\theta_2 = \tan^{-1}\left[\left\{\frac{(R_1 \cdot R_2 - Z_0^2) \cdot (R_2 - R_1)}{R_1^2 \cdot R_2}\right\}^{\frac{1}{2}}\right] \quad (0 < \theta_2 < 90) \tag{2}$$

Furthermore, the phase line 22, which is a phase line having the electrical length $\theta_3$ [deg] given by the following expression (3), is connected between the input splitting circuit 3 and the peak amplifier 7.

$$\theta_3 = \theta_1 - \theta_2 + \theta_c - \theta_p \tag{3}$$

Next, the operation will be described.

When the level of the input signal of FIG. 1 is small, the class B or class C biased peak amplifier 7 is in the OFF state, that is, in the state in which it does not amplify the RF signal. Accordingly, only the RF signal from the carrier amplifier 3 is supplied to the output combining point 13. Thus, when the input signal level is small, since the peak amplifier 7 is in the OFF state, the output impedance of the peak amplifier 7 viewed from the impedance reference point 12 at the output side of the peak amplifier 7 is ideally infinity (open). In addition, since the electrical length $\theta_2$ of the phase line 23 becomes less than 90°, the phase line 23 with the electrical length $\theta_2$ functions as a capacitive open stub.

Therefore the impedance seen by looking into the phase line 23 from the output combining point 13 is converted into an impedance Z1 that has a resistance component less than R/2 and has capacitive reactance. In addition, because of the impedance conversion function of the phase line 21 having the electrical length $\theta_1$ the load impedance seen by looking into the output side from the impedance reference point 11 at the output side of the carrier amplifier 3 is converted into a real resistance $2R + \alpha$ greater than 2R.

Figure 2:
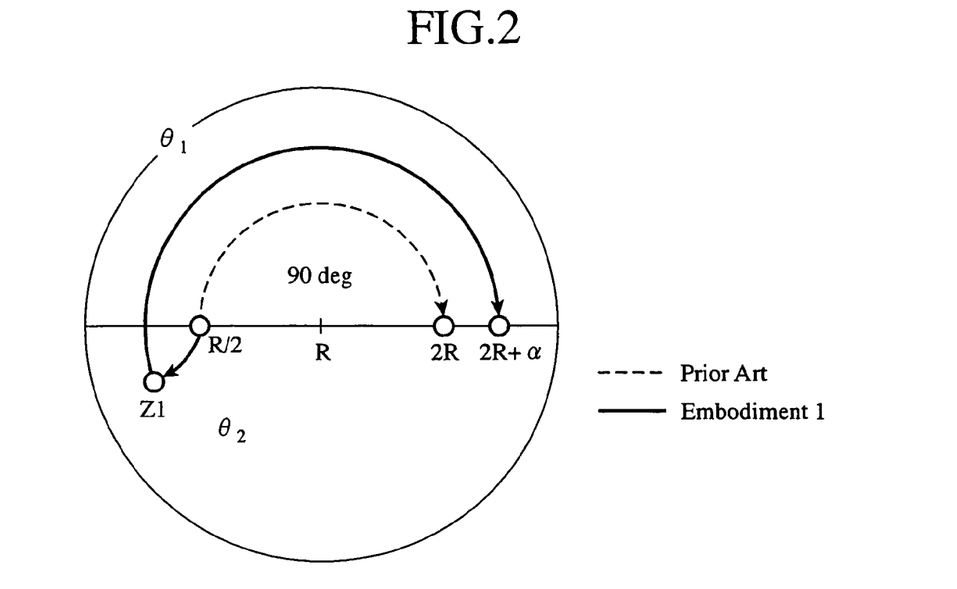
FIG. 2 is a diagram illustrating a Smith chart on which the locus of the load modulation of the high efficiency amplifier of the embodiment 1 in accordance with the present invention is drawn.

FIG. 2 is a diagram illustrating a Smith chart on which the locus of the load modulation of the high efficiency amplifier is drawn. In the conventional Doherty amplifier, the locus of the load modulation varies from R/2 to 2R as indicated by a broken curve of FIG. 2. In contrast with this, in the high efficiency amplifier of the present embodiment 1, the locus of the load modulation varies from Z1 to $2R + \alpha$ as indicated by the solid curve of FIG. 2.

Figure 3:
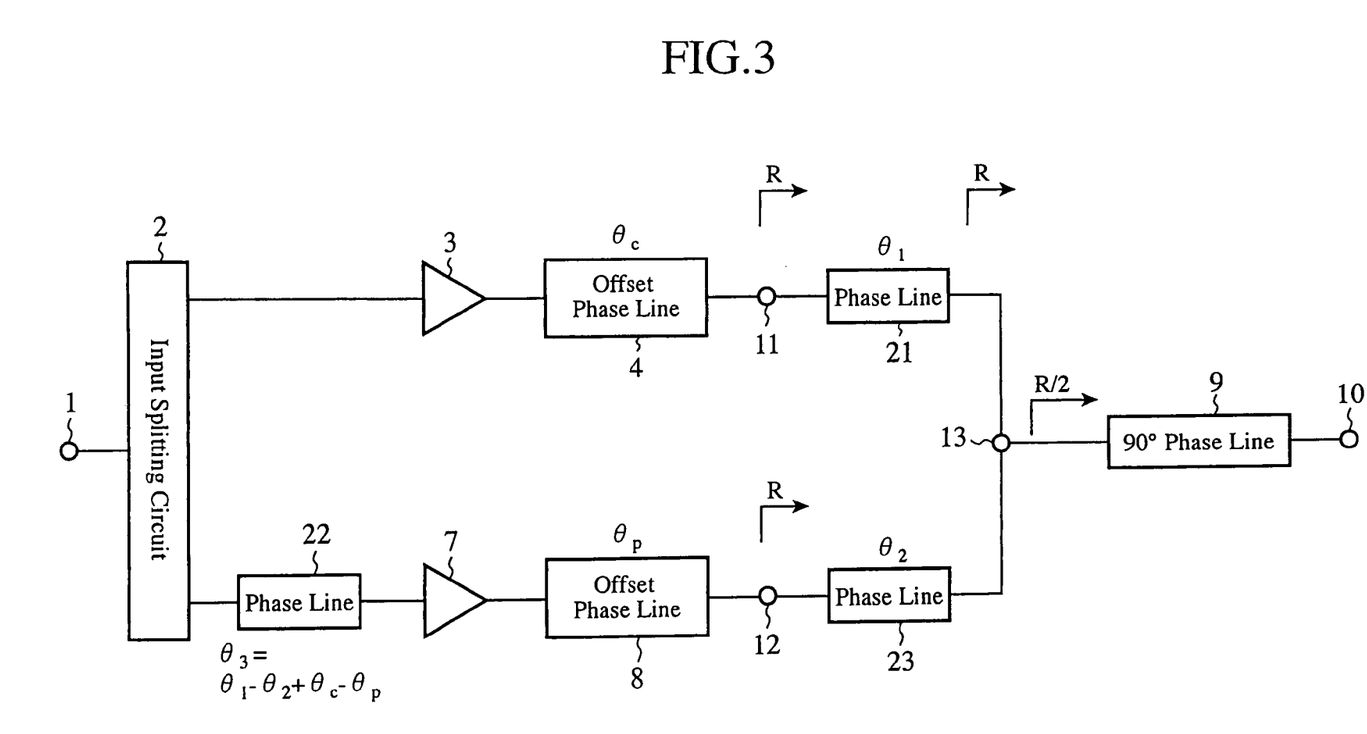
FIG. 3 is a block diagram showing the configuration of the high efficiency amplifier of the embodiment 1 in accordance with the present invention, electrical lengths of its various portions, and impedances viewed from various points when the input signal level is large.

FIG. 3 is a block diagram showing the configuration of the high efficiency amplifier of the embodiment 1 in accordance with the present invention, electrical lengths of its various portions, and impedances viewed from various points when the input signal level is large, in which the same reference numerals as those of FIG. 1 designate the same components. In FIG. 3, when the input signal level is large, the class B or class C biased peak amplifier 7 is placed in the ON state, that is, in the state in which it amplifies the RF signal. Thus, at the output combining point 13, the RF signals fed from the carrier amplifier 3 and peak amplifier 7 are combined and output. In this case, the load impedance seen by looking into the output side from the impedance reference point 11 at the output side of the carrier amplifier 3 and the load impedance seen by looking into the output side from the impedance reference point 12 at the output side of the peak amplifier 7 are both R.

Here, if the high efficiency amplifier is designed in advance in such a manner that when the load impedance is 2R+α, the carrier amplifier 3 has low saturation power but high efficiency, and that when the load impedance is R, the carrier amplifier 3 and peak amplifier 7 have large saturation power each. Then, it is possible for the carrier amplifier 3 to operate at high efficiency when the input signal level is small, and for the carrier amplifier 3 and peak amplifier 7 to operate in such a manner that they have large saturation power when the input signal level is large.

According to the two functions, that is, the function that the output of the peak amplifier 7 is combined with that of the carrier amplifier 3 in response to the input signal level, and the function that the load impedance seen by looking into the output side from the carrier amplifier 3 and peak amplifier 7 varies in response to the input signal level, the present embodiment 1 makes it possible to implement the high efficiency operation in the state in which the output back-off from the saturation is large.

Figure 4:
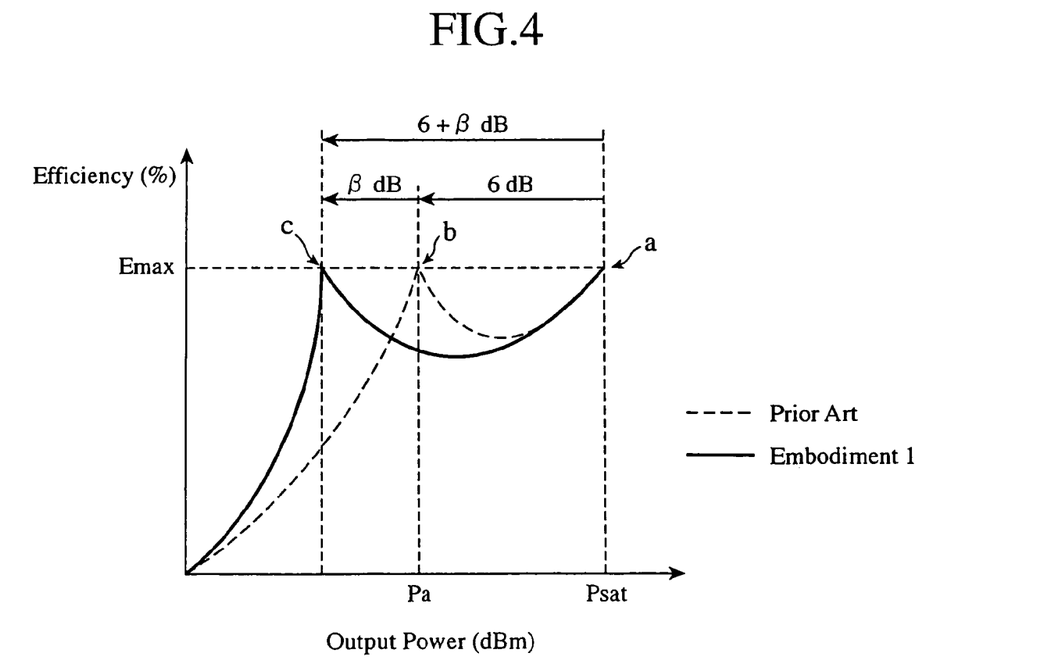
FIG. 4 is a graph illustrating efficiency characteristics versus output power of the high efficiency amplifier of the embodiment 1 in accordance with the present invention.

FIG. 4 is a graph illustrating efficiency characteristics versus output power of the high efficiency amplifier. Here, the high efficiency amplifier of the present embodiment 1 is compared with the conventional Doherty amplifier. Besides, in the present embodiment 1, when the input signal level shifts from a small signal to a large signal, the impedance seen by looking into the output side from the impedance reference point 11 at the output side of the carrier amplifier 3 shifts from the real resistance 2R+α (where α is positive) to R. Accordingly, as illustrated in FIG. 4, in addition to the saturating point a of the Doherty amplifier, it is possible for the present embodiment 1 to have the efficiency maximum point at a point cat which the output back-off is (6+β) dB (where β is positive) which is greater than the output back-off of 6 dB at the point b.

Thus, when the input signal level is small, the present embodiment 1 can make the impedance seen by looking into the output side from the impedance reference point 11 at the output side of the carrier amplifier 3 greater than the impedance 2R of the conventional Doherty amplifier. Accordingly, by that amount, it can set the first efficiency maximum point at the small signal level point c at which the output back-off is greater than at the point b at which the output back-off is 6 dB of the conventional Doherty amplifier. Thus, the present embodiment 1 can increase the efficiency more effectively at the small signal operating level at which the output back-off is greater than 6 dB, thereby being able to bring the Efficiency to a higher level.

Like the conventional Doherty amplifier, the present embodiment 1 has the offset phase line 4 connected to the output side of the carrier amplifier 3 and the offset phase line 8 connected to the output side of the peak amplifier 7. However, the offset phase line 4 and offset phase line 8 can be eliminated, in which case the foregoing expression (3) is replaced by the following expression (4).

$$\theta_3 = \theta_1 - \theta_2 \quad (4)$$

In this way, in the present embodiment 1, the input splitting circuit 2 splits the input signal into two paths (first and second paths) with connecting the first path to the carrier amplifier 3 and the second path to the peak amplifier 7; the output combining point 13 of the two paths is connected to the 90° phase line (impedance converting circuit) 9; and the phase line (first phase line) 21 is connected between the impedance reference point 11 at the output side of the carrier amplifier 3 and the output combining point 13, the phase line (second phase line) 22 is connected between the input splitting circuit 2 and the peak amplifier 7, and the phase line (third phase line) 23 is connected between the impedance reference point 12 at the output side of the peak amplifier 7 and the output combining point 13. In addition, when the input signal level is small, the electrical length $\theta_1$ of the phase line 21 and the electrical length $\theta_2$ of the phase line 23 are set in such a manner that the impedance seen by looking into the output side from the impedance reference point 11 at the output side of the carrier amplifier 3 becomes 2R+α, and the electrical length $\theta_3$ of the phase line 22 is set at the difference between the electrical length $\theta_1$ of the phase line 21 and the electrical length $\theta_2$ of the phase line 23.

As described above, according to the present embodiment 1, the phase line 21 with the electrical length $\theta_1$ is connected between the impedance reference point 11 at the output side of the carrier amplifier 3 and the output combining point 13, the phase line 22 with the electrical length $\theta_3$ is connected between the input splitting circuit 2 and the peak amplifier 7, and the phase line 23 with the electrical length $\theta_2$ is connected between the impedance reference point 12 at the output side of the peak amplifier 7 and the output combining point 13; and when the input signal level is small, the electrical length $\theta_1$ of the phase line 21 and the electrical length $\theta_2$ of the phase line 23 are set in such a manner that the impedance seen by looking into the output side from the impedance reference point 11 at the output side of the carrier amplifier 3 becomes 2R+α, and the electrical length $\theta_3$ of the phase line 22 is set at the difference between the electrical length $\theta_1$ of the phase line 21 and the electrical length $\theta_2$ of the phase line 23. Thus, the present embodiment 1 can make the output back-off that will maximize the efficiency greater than 6 dB, thereby offering an advantage of being able to improve the efficiency at the small signal operating level at which the output back-off is greater than 6 dB.

Embodiment 2

Figure 5:
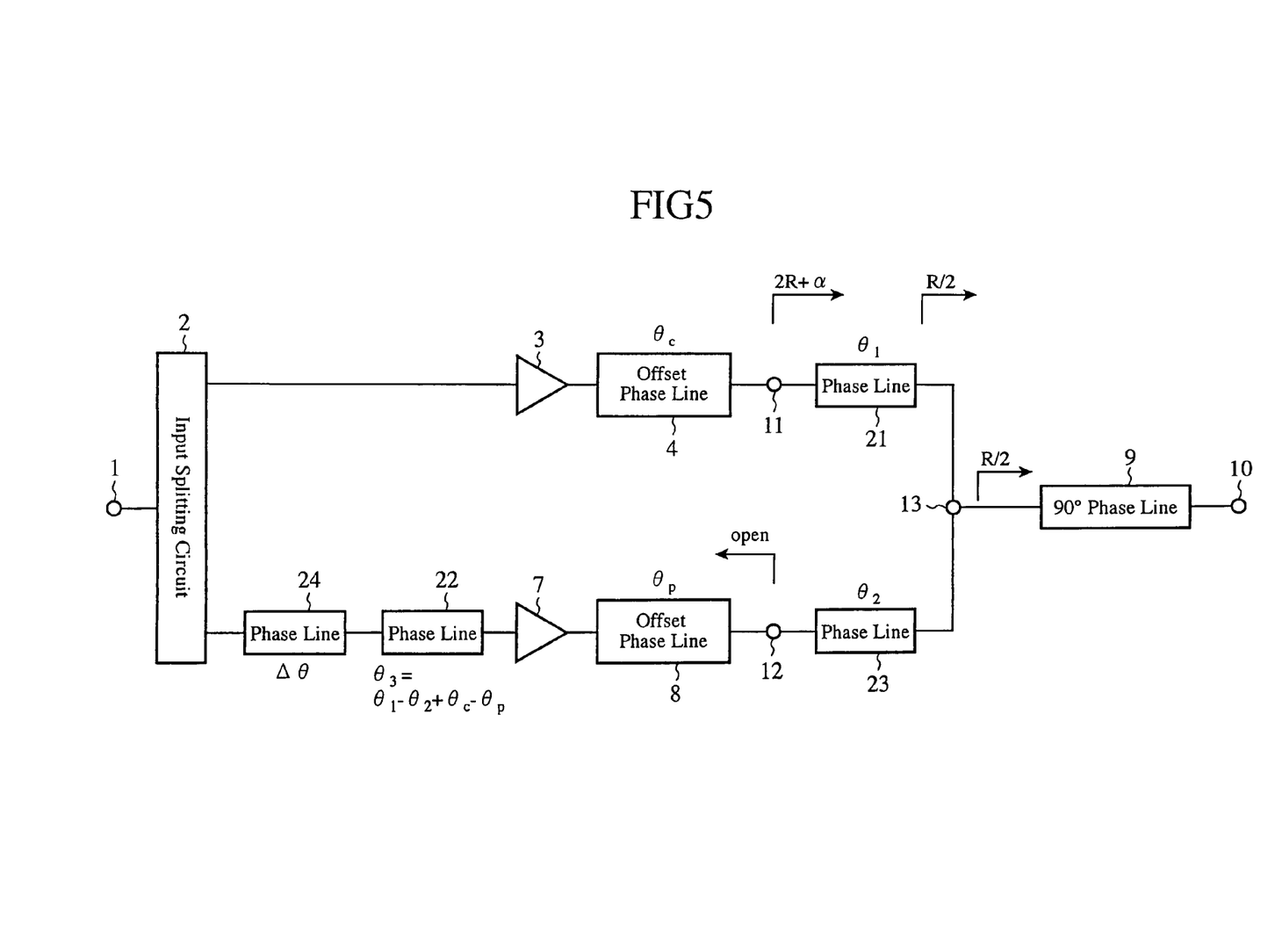
FIG. 5 is a block diagram showing a configuration of the high efficiency amplifier of an embodiment 2 in accordance with the present invention, electrical lengths of its various portions, and impedances viewed from various points when the input signal level is small.

FIG. 5 is a block diagram showing a configuration of the high efficiency amplifier of an embodiment 2 in accordance with the present invention, electrical lengths of its various portions, and impedances viewed from various points when the input signal level is small. The high efficiency amplifier shown in FIG. 5 is one that adds a phase line (fourth phase line) 24 to the high efficiency amplifier shown in FIG. 1 of the foregoing embodiment 1, and the remaining configuration is the same as that of FIG. 1.

Figure 6:
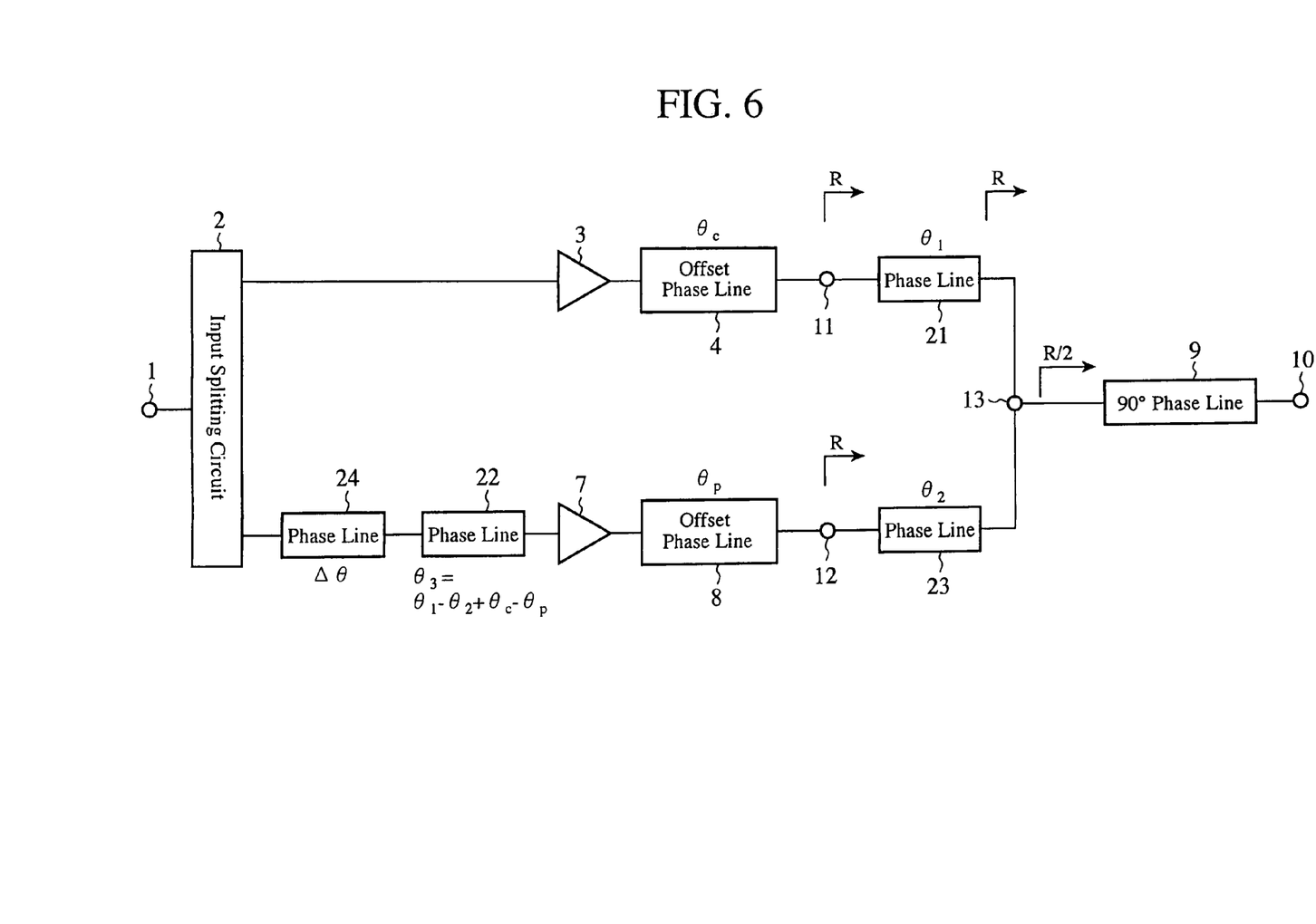
FIG. 6 is a block diagram showing the configuration of the high efficiency amplifier of the embodiment 2 in accordance with the present invention, electrical lengths of its various portions, and impedances viewed from various points when the input signal level is large.

In addition, FIG. 6 is a block diagram showing a configuration of the high efficiency amplifier of the embodiment 2 in accordance with the present invention, electrical lengths of its various portions, and impedances viewed from various points when the input signal level is large. The high efficiency amplifier shown in FIG. 6 is one that adds the phase line 24 to the high efficiency amplifier shown in FIG. 3 of the foregoing embodiment 1, and the remaining configuration is the same as that of FIG. 3.

The phase line 24, which has an electrical length Δθ [deg] given by the following expression (5), is connected between the input splitting circuit 3 and the peak amplifier 6.

$$\Delta\theta = \theta_{CA} - \theta_{PA} \quad (5)$$

where $\theta_{CA}$ is the electrical length of the carrier amplifier 3 and $\theta_{PA}$ is the electrical length of the peak amplifier 7.

Next, the operation will be described.

In FIG. 6, when the input signal level is large, the class B or class C biased peak amplifier 7 is brought into the ON state, that is, into the state in which it amplifies the RF signal. Thus, at the output combining point 13, the RF signals from the carrier amplifier 3 and peak amplifier 7 are combined and output.

In this case, in the present embodiment 2, since the phase line 24 connected to the input side of the peak amplifier 7 corrects the difference $\Delta\theta$ between the electrical length $\theta_{CA}$ of the class A or class AB biased carrier amplifier 3 and the electrical length $\theta_{PA}$ of the class B or class C biased peak amplifier 7, the RF signals from the carrier amplifier 3 and peak amplifier 7 can be combined in the same phase at the output combining point 13. Thus, the combining efficiency of the RF signals increases in the region in which the input signal level is large.

Figure 7:
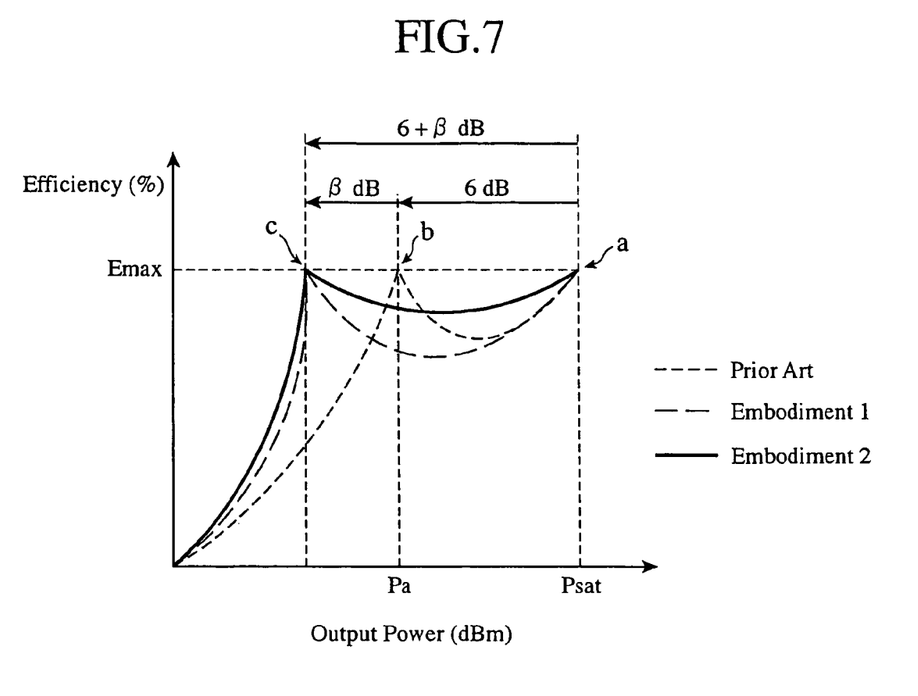
FIG. 7 is a graph illustrating efficiency characteristics versus output power of the high efficiency amplifier of the embodiment 2 in accordance with the present invention.

FIG. 7 illustrates the efficiency characteristics versus output power of the high efficiency amplifier. Here, the high efficiency amplifier of the present embodiment 2 is compared with the conventional Doherty amplifier and the high efficiency amplifier of the foregoing embodiment 1. As illustrated in FIG. 7, compared with the foregoing embodiment 1, the present embodiment 2 improves the combining efficiency of the RF signal in the region in which the input signal level is large. As a result, it can attain the high efficiency of the amplifier.

The remaining operation is the same as that of the foregoing embodiment 1.

Like the conventional Doherty amplifier, the present embodiment 2 has the offset phase line 4 connected to the output side of the carrier amplifier 3 and the offset phase line 8 connected to the output side of the peak amplifier 7. However, the offset phase line 4 and offset phase line 8 can be eliminated, As described above, the present embodiment 2 offers the same advantage as that of the foregoing embodiment 1. In addition, it offers an advantage of being able to further improve the efficiency by having the phase line 24, which is connected to the input side of the peak amplifier 7, correct the difference between the electrical length $\theta_{CA}$ of the carrier amplifier 3 and the electrical length $\theta_{PA}$ of the peak amplifier 7.

Embodiment 3

Figure 8:
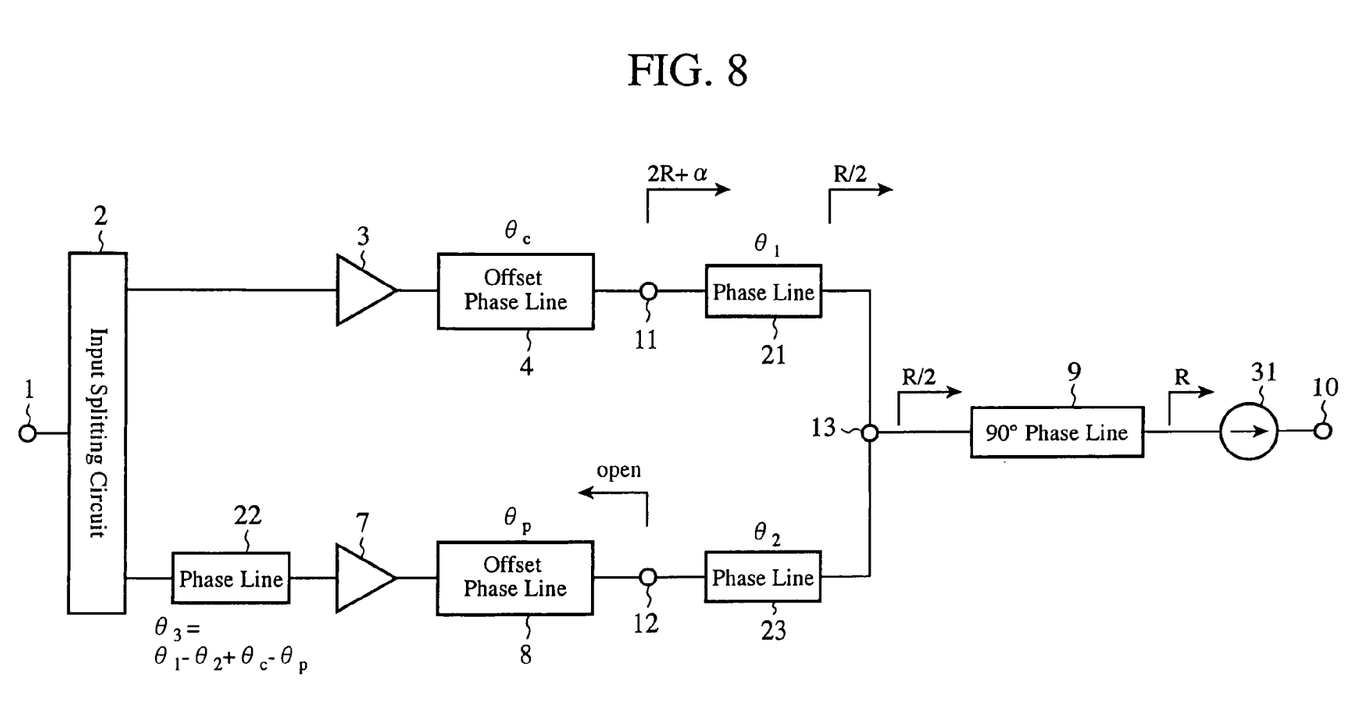
FIG. 8 is a block diagram showing a configuration of the high efficiency amplifier of an embodiment 3 in accordance with the present invention, electrical lengths of its various portions, and impedances viewed from various points when the input signal level is small.

FIG. 8 is a block diagram showing a configuration of the high efficiency amplifier of an embodiment 3 in accordance with the present invention, electrical lengths of its various portions, and impedances viewed from various points when the input signal level is small. The high efficiency amplifier shown in FIG. 8 is one that adds an isolator 31 with a characteristic impedance R to the output side of the 90° phase circuit 9 in the high efficiency amplifier shown in FIG. 1 of the foregoing embodiment 1. The remaining configuration is the same as that of FIG. 1.

Next, the operation will be described.

In FIG. 8, the isolator 31 with the characteristic impedance R, which is connected to the output side of the 90° phase circuit 9, determines the load impedance viewed from the output combining point 13 at R/2. Thus, the high efficiency amplifier can operate stably at high efficiency regardless of the circuit state on and after the output terminal 10.

Figure 9:
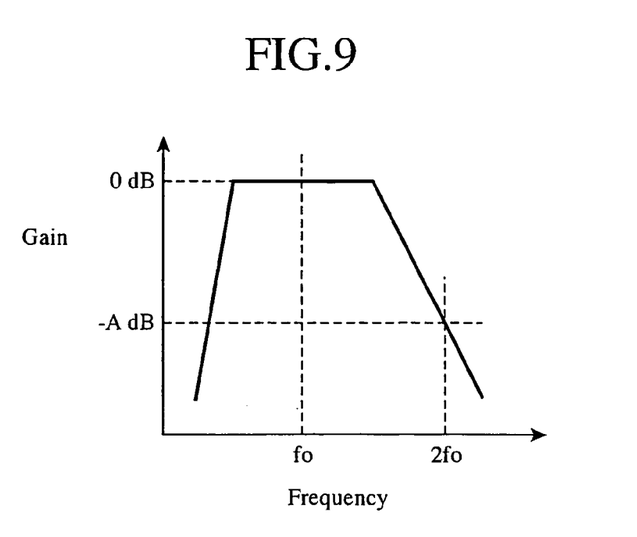
FIG. 9 is a graph illustrating frequency characteristics of an isolator of the high efficiency amplifier of the embodiment 3 in accordance with the present invention.

FIG. 9 is a graph illustrating frequency characteristics of the isolator 31. As illustrated in FIG. 9, for the frequency $f_0$ of the RF signal, the isolator 31 has the frequency characteristics that will reject the harmonics of the RF signal such as the double frequency $2f_0$ outside the band, thereby being able to suppress the harmonics.

Like the conventional Doherty amplifier, the present embodiment 3 has the offset phase line 4 connected to the output side of the carrier amplifier 3 and the offset phase line 8 connected to the output of the peak amplifier 7 side. However, the offset phase line 4 and offset phase line 8 can be eliminated, As described above, the present embodiment 3 offers the same advantage as that of the foregoing embodiment 1. In addition, it offers an advantage of being able to perform stable operation at high efficiency with suppressing the harmonics by connecting the isolator 31 with the characteristic impedance R to the output side of the 90° phase circuit 9.

Embodiment 4

Figure 10:
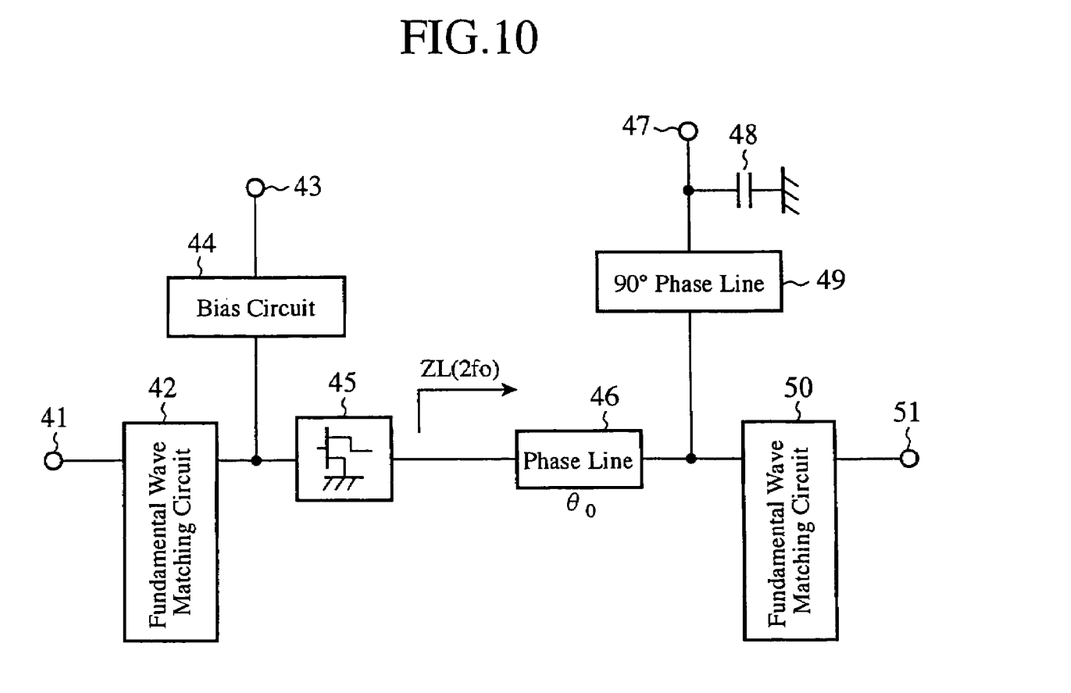
FIG. 10 is a block diagram showing an internal configuration of the carrier amplifier or of the peak amplifier of the high efficiency amplifier of an embodiment 4 in accordance with the present invention.

FIG. 10 is a block diagram showing an internal configuration of the carrier amplifier 3 or of the peak amplifier 7 of the high efficiency amplifier of an embodiment 4 in accordance with the present invention. The carrier amplifier 3 and the peak amplifier 7 shown in FIG. 10 each include an input terminal 41, a fundamental wave matching circuit 42, a power supply terminal 43, a bias circuit 44, a transistor (amplifying device) 45, a phase line (fifth phase line) 46, a power supply terminal 47, a capacitor 48, a 90° phase line 49, a fundamental wave matching circuit 50 and an output terminal 51.

Next, the operation will be described.

In FIG. 10, the input side of the transistor 45 is supplied with the bias voltage from the power supply terminal 43 via the bias circuit 44. In addition, the capacitor 48 and 90° phase line 49 constitute the output side bias circuit of the transistor 45 so that the output side of the transistor 45 is supplied with the bias voltage from the power supply terminal 47 via the phase line 49 and phase line 46. The RF signal, which is input via the input terminal 41 and passes through the fundamental wave matching circuit 42, is amplified by the transistor 45, and is output from the output terminal 51 via the phase line 46 and fundamental wave matching circuit 50.

The capacitor 48, which is assumed to have a small enough impedance at the frequency $f_0$ of the RF signal, constitutes a short-circuit point between the 90° phase line 49 and the power supply terminal 47 at the frequency $f_0$ of the RF signal. Assume that the 90° phase line 49 is a short-circuit stub with the electrical length of 90° at the frequency $f_0$ of the RF signal. Then, the electrical length becomes 180° at the frequency $2f_0$ twice the frequency of the RF signal. Thus, a short-circuit point is formed between the phase line 46 and 90° phase line 49 at the frequency $2f_0$, twice the frequency of the RF signal.

Varying the electrical length $\theta_0$ of the phase line 46 will alter the distance to the short-circuit point at the double frequency $2f_0$ viewed from the transistor 45. Accordingly, the impedance $ZL(2f_0)$ seen by looking into the output side from the transistor 45 at the double frequency $2f_0$ varies. Generally, the efficiency of the amplifier has a dependence on the impedance at the double frequency. Thus, optimizing the electrical length $\theta_0$ of the phase line 46 makes it possible to suppress the harmonics of the double frequency $2f_0$ of the RF signal and to maximize the efficiency of the carrier amplifier 3 and peak amplifier 7.

Figure 11:
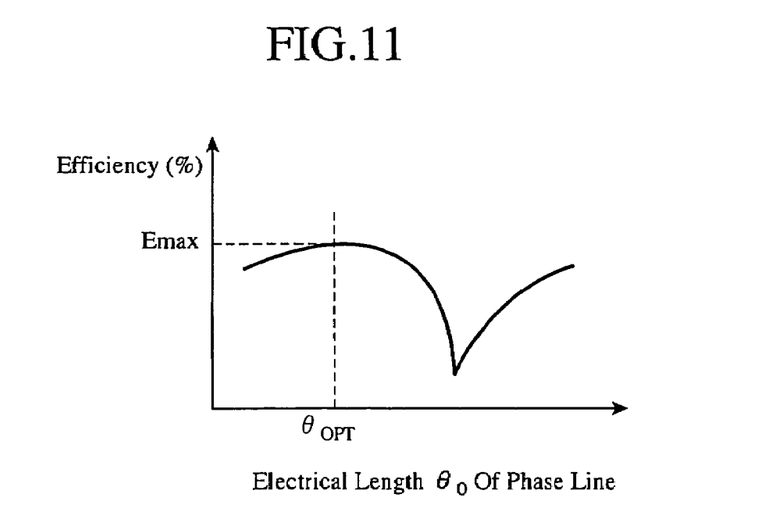
FIG. 11 is a graph illustrating efficiency characteristics of the carrier amplifier and peak amplifier versus the electrical length of the phase line in the high efficiency amplifier of the embodiment 4 in accordance with the present invention.

FIG. 11 is a graph illustrating the efficiency characteristics of the carrier amplifier 3 and peak amplifier 7 versus the electrical length $\theta_0$ of the phase line 46. Adjusting the electrical length $\theta_0$ of the phase line 46 at the optimum value $\theta_{OPT}$ makes it possible to suppress the harmonics of the double frequency $2f_0$ of the RF signal, and to obtain the efficiency $E_{max}$ of the carrier amplifier 3 and peak amplifier 7.

Thus maximizing the efficiency of the carrier amplifier 3 and peak amplifier 7 makes it possible to maximize the efficiency of the high efficiency amplifier in its entirety, and to increase the efficiency even at the small signal level at which the output back-off is large.

As described above, the present embodiment 4 offers the same advantage as the foregoing embodiment 1. In addition, it offers an advantage of being able to increase the efficiency even at the small signal level at which the output back-off is large by supplying the bias voltage of the transistor 45 of the carrier amplifier 3 and peak amplifier 7 via the 90° phase line 49, which becomes a short-circuit stub with the electrical length of 90° at the frequency $f_0$ of the RF signal, and via the phase line 46, and by setting the electrical length $\theta_0$ of the phase line 46 at a value that will reduce the harmonics of the double frequency $2f_0$ of the RF signal and will maximize the efficiency of the carrier amplifier 3 and peak amplifier 7.

Embodiment 5

Figure 12:
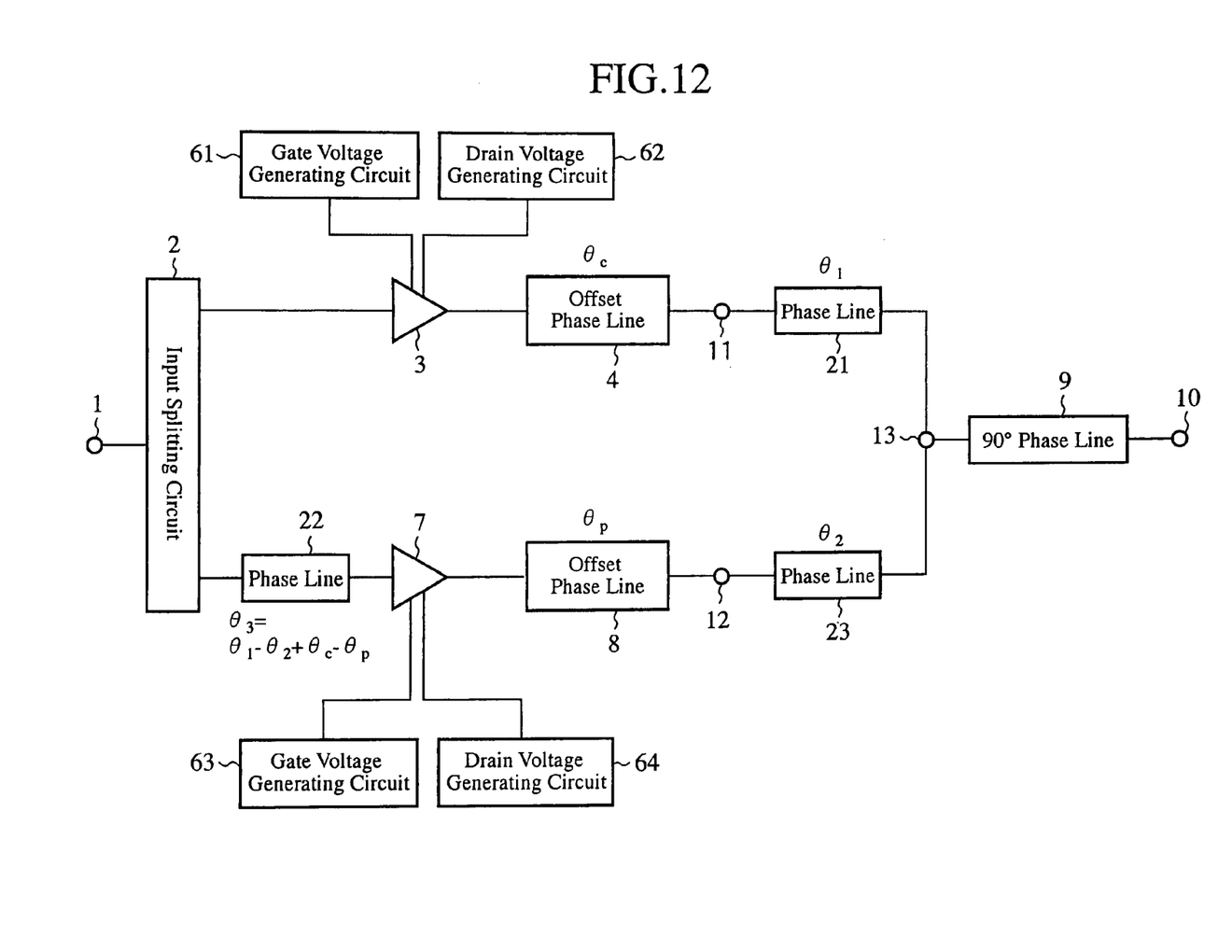
FIG. 12 is a block diagram showing a configuration of the high efficiency amplifier of an embodiment 5 in accordance with the present invention, and electrical lengths of its various portions.

FIG. 12 is a block diagram showing a configuration of the high efficiency amplifier of an embodiment 5 in accordance with the present invention, and electrical lengths of its various portions. The high efficiency amplifier shown in FIG. 12 adds to the high efficiency amplifier shown in FIG. 1 of the foregoing embodiment 1 a gate voltage generating circuit 61 and a drain voltage generating circuit 62 connected to the carrier amplifier 3, and a gate voltage generating circuit 63 and a drain voltage generating circuit 64 connected to the peak amplifier 7. The remaining configuration is the same as that of FIG. 1.

In FIG. 12, it is assumed that the carrier amplifier 3 and peak amplifier 7 employ transistors (not shown) having the same saturation power when the same bias voltage is supplied. In addition, the bias voltage Vd1 the drain voltage generating circuit 62 supplies to the transistor of the carrier amplifier 3 is made less than the bias voltage Vd2 the drain voltage generating circuit 64 supplies to the transistor of the peak amplifier 7. Accordingly, the saturation power of the carrier amplifier 3 is less than the saturation power of the peak amplifier 7. Thus, the present embodiment 5 can have the efficiency maximum point at the output back-off point greater than that of the foregoing embodiment 1.

Figure 13:
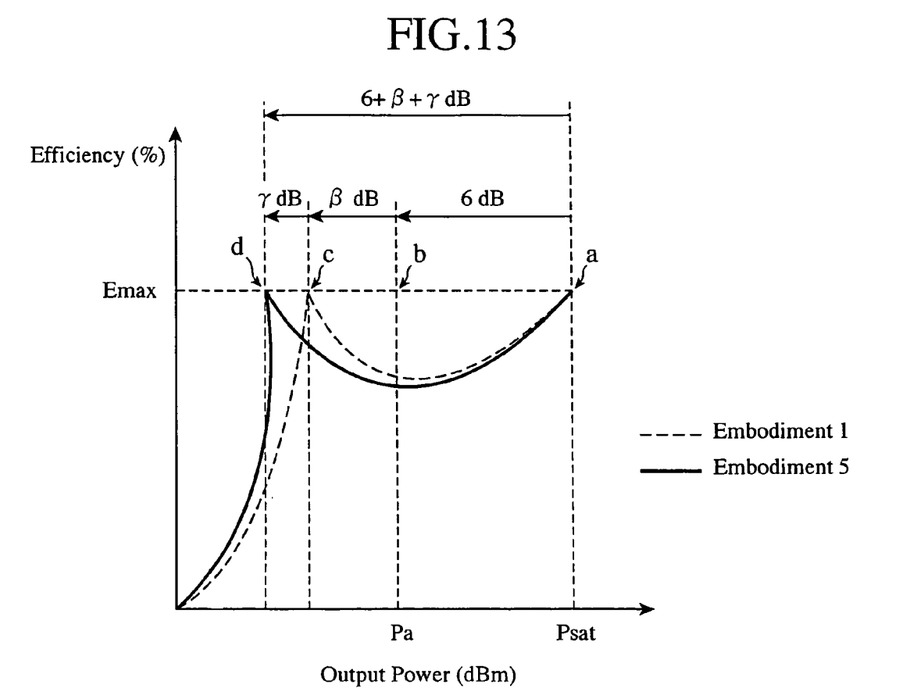
FIG. 13 is a graph illustrating efficiency characteristics versus output power of the high efficiency amplifier of the embodiment 5 in accordance with the present invention.

FIG. 13 illustrates the efficiency characteristics versus output power of the high efficiency amplifier. Here, the high efficiency amplifier of the present embodiment 5 is compared with the high efficiency amplifier of the foregoing embodiment 1. As illustrated in FIG. 13, in addition to the saturating point a of the Doherty amplifier, the high efficiency amplifier of the present embodiment 5 can have the efficiency maximum point at the point d with the output back-off $(6+\beta+\gamma)$ dB (where $\beta$ and $\gamma$ are positive) which is greater than the output back-off $(6+\beta)$ dB at the point c.

As described above, according to the present embodiment 5, the bias voltage Vd1 supplied to the drain of the transistor of the carrier amplifier 3 is made lower than the bias voltage Vd2 supplied to the drain of the transistor of the peak amplifier 7. Thus, the output back-off that will maximize the efficiency can be made greater than that of the foregoing embodiment 1 which is greater than 6 dB. As a result, the present embodiment 5 offers an advantage of being able to further improve the efficiency at the small signal operating level at which the output back-off is greater than 6 dB.

INDUSTRIAL APPLICABILITY

As described above, the high efficiency amplifier in accordance with the present invention can make the output back-off that will maximize the efficiency greater than 6 dB, and is suitable for equipment that must increase the efficiency at the small signal operating level at which the output back-off is greater than 6 dB.

What is claimed is:

1. A high efficiency amplifier comprising:
   an input splitting circuit for splitting an input signal into first and second paths;
   a carrier amplifier connected to the first path;
   a peak amplifier connected to the second path;
   an impedance converting circuit connected to an output combining point of the first and second paths;
   a first phase line connected between an impedance reference point at an output side of said carrier amplifier and the output combining point;
   a second phase line connected between said input splitting circuit and said peak amplifier; and
   a third phase line connected between an impedance reference point at an output side of said peak amplifier and the output combining point, wherein
   when a level of the input signal is small, an electrical length of said first phase line and an electrical length of said third phase line are set in a manner that impedance seen by looking into an output side from the impedance reference point at the output side of said carrier amplifier is made $2R+\alpha$ (where R is a load resistance and $\alpha$ is positive), and an electrical length of said second phase line is set at a difference between the electrical length of said first phase line and the electrical length of said third phase line.

2. The high efficiency amplifier according to claim 1, further comprising:
   a fourth phase line connected between said input splitting circuit and said carrier amplifier, wherein
   the electrical length of said fourth phase line is set at a difference between an electrical length of said carrier amplifier and an electrical length of said peak amplifier.

3. The high efficiency amplifier according to claim 1, further comprising:
   an isolator that is connected to an output of said impedance converting circuit and has a characteristic impedance R.

4. The high efficiency amplifier according to claim 1, wherein
   said carrier amplifier and said peak amplifier have their internal amplifying devices each supplied with a bias voltage via a 90° phase line and a fifth phase line, said 90° phase line constituting a short-circuit stub with an electrical length of 90° at a frequency of the input signal; and
   an electrical length of said fifth phase line is set at a value that suppresses harmonics of a frequency twice the frequency of the input signal, and maximizes efficiency.

5. The high efficiency amplifier according to claim 1, wherein
   a bias voltage supplied to an output side of an internal amplifying device of said carrier amplifier is set at a value smaller than a bias voltage supplied to an output side of an internal amplifying device of said peak amplifier.

* * * * *